(12) United States Patent
Choi

(10) Patent No.: US 6,385,106 B2
(45) Date of Patent: May 7, 2002

(54) SYNCHRONOUS TYPE FLIP-FLOP CIRCUIT OF SEMICONDUCTOR DEVICE

(75) Inventor: Young Bae Choi, Kyoungki-do (KR)

(73) Assignee: Hyundai Electronics Industries, Co., Ltd., Kyoungki-do (KR)

( * ) Notice: Subject to any disclaimer, the term of this patent is extended or adjusted under 35 U.S.C. 154(b) by 0 days.

(21) Appl. No.: 09/725,456

(22) Filed: Nov. 30, 2000

(30) Foreign Application Priority Data

Nov. 30, 1999 (KR) .............................. 99-53893

(51) Int. Cl.[7] .................................. G11C 7/00
(52) U.S. Cl. ........................ 365/203; 365/233
(58) Field of Search ................. 365/203, 233

(56) References Cited

U.S. PATENT DOCUMENTS 5,294,842 A * 3/1994 Iknaian et al. ............. 307/269
6,297,668 B1 * 10/2001 Schober ..................... 326/101

FOREIGN PATENT DOCUMENTS

JP          0038996   *  3/1984  ........... G11C/11/34

OTHER PUBLICATIONS

Betty Prince, "Semiconductor Memories", 1983, Wiley, 2nd pp. 472–474.*

* cited by examiner

Primary Examiner—David Nelms
Assistant Examiner—M. Tran
(74) Attorney, Agent, or Firm—Pillsbury Winthrop LLP

(57) ABSTRACT

Disclosed is a synchronous type flip-flop circuit of a semiconductor device including a first clock buffer unit for buffering a complement signal of a data signal input at a first potential level of a clock signal. A second clock buffer unit buffers a complement signal of a signal output from the first clock buffer unit at the first potential level of the clock signal. A precharge latch unit precharges a first node and a second node with a supply voltage at the first potential level of the clock signal, differentially amplifying respective potentials of the first and second nodes by output signals from the first and second clock buffer units at a second potential level of the clock signal, and outputting the amplified signals while latching the amplified signals. The synchronous type flip-flop circuit of the present invention has no requirement to take into consideration problems associated with a transistor ratio. This enables a reduced circuit area and an increased operating speed.

10 Claims, 4 Drawing Sheets

SYNCHRONOUS TYPE FLIP-FLOP CIRCUIT OF SEMICONDUCTOR DEVICE

BACKGROUND OF THE INVENTION

1. Field of the Invention

The present invention relates to a synchronous type flip-flop circuit of a semiconductor device, and more particularly to a synchronous type flip-flop circuit capable of achieving high-speed operation while having a reduced size with respect to known synchronous type flip-flop circuits, so as to cope with semiconductor devices having a reduced size while using an increased clock speed.

2. Description of Related Art

Generally, a flip-flop circuit is a memory device having two stable states. In such a flip-flop circuit, a selected one of two stable states is activated in response to an input selecting that stable state, and this activated stable state is maintained until an input selecting the other stable state is applied. A synchronous type flip-flop circuit is a flip-flop circuit for inputting or outputting a signal in sync with a clock applied to a clock pulse input terminal thereof.

Referring to FIGS. 1 to 3, various configurations of a conventional synchronous type flip-flop circuit used in semiconductor devices are illustrated, respectively. FIGS. 1 and 2 show conventional synchronous type flip-flop circuits using clock buffers, respectively. FIG. 3 shows another synchronous type flip-flop circuit using transfer gates and clock buffers.

The conventional synchronous type flip-flop circuit illustrated in FIG. 1 includes a first clock buffer unit 10 for outputting a signal of a 'high' level to a node Nd1 in a 'low' level of a clock signal clk when an input signal D has a 'low' level, while outputting a signal of a 'low' level to the node Nd1 in a 'high' level of the clock signal clk when the input signal D has a 'high' level, and a second clock buffer unit 12 for outputting a signal of a 'high' level to a node Nd2 in the 'low' level of the clock signal clk when the node Nd1 is at a 'low' level, while outputting a signal of a 'low' level to the node Nd2 in the 'high' level of the clock signal clk when the node Nd1 is at a 'high' level. The flip-flop circuit also includes a third clock buffer unit 14 for outputting a signal of a 'high' level to a node Nd3 in the 'low' level of the clock signal clk when the node Nd2 is at a 'low' level, while outputting a signal of a 'low' level to the node Nd3 in the 'high' level of the clock signal clk when the node Nd2 is at a 'high' level, a fourth clock buffer unit 16 for outputting a signal of a 'high' level to an output node Nd4 in the 'low' level of the clock signal clk when the node Nd3 is at a 'low' level, while outputting a signal of a 'low' level to the output node Nd4 in the 'high' level of the clock signal clk when the node Nd3 is at a 'high' level, and an inverter INV1 coupled between the output node Nd4 and another output node Nd5.

The first clock buffer unit 10 includes a PMOS transistor P1 adapted to supply a supply voltage to the node Nd1 in the 'low' level of the clock signal clk, and a pair of NMOS transistors N1 and N2 connected in series between the node Nd1 and a ground voltage. The NMOS transistor NI receives the input signal D at the gate thereof whereas the NMOS transistor N2 receives the clock signal clk at the gate thereof. Accordingly, the first clock buffer unit 10 outputs a 'high' signal to the node Nd1 in the 'low' level of the clock signal clk in response to the 'low' level of the input signal D while outputting a 'low' signal to the node Nd1 in the 'high' level of the clock signal clk in response to the 'high' level of the input signal D.

The second clock buffer unit 12 includes a PMOS transistor P2 adapted to supply the supply voltage to the node Nd2 in the 'low' level of the clock signal clk, and a pair of NMOS transistors N3 and N4 connected in series between the node Nd2 and the ground voltage. The NMOS transistor N3 receives the clock signal clk at the gate thereof whereas the NMOS transistor N4 receives a signal from the node Nd1 at the gate thereof. Accordingly, the second clock buffer unit 12 outputs a 'high' signal to the node Nd2 in the 'low' level of the clock signal clk in response to the 'low' level of the node Nd1 while outputting a 'low' signal to the node Nd2 in the 'high' level of the clock signal clk in response to the 'high' level of the node Nd1.

The third clock buffer unit 14 includes a PMOS transistor P3 activated in the 'low' level of the clock signal clk, and another PMOS transistor P4 activated at the 'low' level of the node Nd2. The PMOS transistors P3 and P4 serve to supply the supply voltage to the node Nd3. The third clock buffer unit 14 also includes an NMOS transistor N5 for discharging the potential of the node Nd3 to the ground voltage in the 'high' level of the clock signal clk. By this configuration, the third clock buffer unit 14 outputs a 'high' signal to the node Nd3 in the 'low' level of the clock signal clk in response to the 'low' level of the node Nd2 while outputting a 'low' signal to the node Nd3 in the 'high' level of the clock signal clk in response to the 'high' level of the node Nd2.

The fourth clock buffer unit 16 includes a PMOS transistor P5 activated at the 'low' level of the node Nd3, and another PMOS transistor P6 activated in the 'low' level of the clock signal clk. The PMOS transistors P3 and P4 serve to supply the supply voltage to the output node Nd4. The fourth clock buffer unit 16 also includes an NMOS transistor N6 for discharging the potential of the output node Nd4 to the ground voltage in the 'high' level of the clock signal clk. By this configuration, the fourth clock buffer unit 16 outputs a 'high' signal to the output node Nd4 in the 'low' level of the clock signal clk in response to the 'low' level of the node Nd3 while outputting a 'low' signal to the output node Nd4 in the 'high' level of the clock signal clk in response to the 'high' level of the node Nd3.

The conventional synchronous type flip-flop circuit illustrated in FIG. 2 includes a first clock buffer unit 20 for outputting a signal of a 'high' level to a node Nd6 in a 'low' level of a clock signal clk when an input signal D has a 'low' level, while outputting a signal of a 'low' level to the node Nd6 in a 'high' level of the clock signal clk when the input signal D has a 'high' level, and a second clock buffer unit 22 for outputting a signal of a 'high' level to a node Nd7 in the 'low' level of the clock signal clk when the node Nd6 is at a 'low' level, while outputting a signal of a 'low' level to the node Nd7 in the 'high' level of the clock signal clk when the node Nd6 is at a 'high' level. The flip-flop circuit also includes a third clock buffer unit 24 for outputting a signal of a 'high' level to a node Nd8 in the 'low' level of the clock signal clk when the node Nd7 is at a 'low' level, while outputting a signal of a 'low' level to the node Nd8 in the 'high' level of the clock signal clk when the node Nd7 is at a 'high' level, a fourth clock buffer unit 26 for outputting a signal of a 'high' level to an output node Nd9 in the 'low' level of the clock signal clk when the node Nd8 is at a 'low' level, while outputting a signal of a 'low' level to the output node Nd9 in the 'high' level of the clock signal clk when the node Nd8 is at a 'high' level, and an inverter INV2 coupled between the output node Nd9 and another output node Nd10.

The first clock buffer unit 20 includes a PMOS transistor P7 adapted to supply a supply voltage to the node Nd6 at the 'low' level of the input signal D, and a pair of NMOS transistors N7 and N8 connected in series between the node Nd6 and a ground voltage. The NMOS transistor N7 receives the clock signal clk at the gate thereof whereas the NMOS transistor N8 receives the input signal D at the gate thereof. The first clock buffer unit 20 outputs a 'high' signal to the node Nd6 in the 'low' level of the clock signal clk in response to the 'low' level of the input signal D while outputting a 'low' signal to the node Nd6 in the 'high' level of the clock signal clk in response to the 'high' level of the input signal D.

The second clock buffer unit 22 includes a PMOS transistor P8 adapted to supply the supply voltage to the node Nd7 at the 'low' level of the node Nd6, and a pair of NMOS transistors N9 and N10 connected in series between the node Nd7 and the ground voltage. The NMOS transistor N9 receives the clock signal clk at the gate thereof whereas the NMOS transistor N10 receives a signal from the node Nd6 at the gate thereof. Accordingly, the second clock buffer unit 22 outputs a 'high' signal to the node Nd7 in the 'low' level of the clock signal clk in response to the 'low' level of the node Nd6 while outputting a 'low' signal to the node Nd7 in the 'high' level of the clock signal clk in response to the 'high' level of the node Nd6.

The third clock buffer unit 24 includes a PMOS transistor P9 activated at the 'low' level of the node Nd7 to supply the supply voltage to the node Nd8. The third clock buffer unit 24 also includes a PMOS transistor P10 activated in the 'low' level of the clock signal clk, and an NMOS transistor N11 activated at the 'high' level of the node Nd7. The PMOS transistor P10 and NMOS transistor N11 serve to discharge the potential of the node Nd8 to the ground voltage. By this configuration, the third clock buffer unit 24 outputs a 'high' signal to the node Nd8 at the 'low' level of the node Nd7 while outputting a 'low' signal to the node Nd8 in the 'low' level of the clock signal clk in response to the 'high' level of the node Nd7.

The fourth clock buffer unit 26 includes a PMOS transistor P11 activated at the 'low' level of the node Nd8, and another PMOS transistor P12 activated in the 'low' level of the clock signal clk. The PMOS transistors P11 and P12 serve to supply the supply voltage to the output node Nd9. The fourth clock buffer unit 26 also includes an NMOS transistor N12 for discharging the potential of the output node Nd9 to the ground voltage at the 'high' level of the node Nd8. The fourth clock buffer unit 26 outputs a 'high' signal to the output node Nd9 in the 'low' level of the clock signal clk in response to the 'low' level of the node Nd8 while outputting a 'low' signal to the output node Nd9 in response to the 'high' level of the node Nd8.

The conventional synchronous type flip-flop circuit illustrated in FIG. 3 includes a transfer gate P13–N13 consisting of a PMOS transistor P13 and an NMOS transistor N13 respectively receiving a clock signal clk and a clock bar signal clkb and serving to transfer an input signal D to a node Nd11 in response to the clock signal clk and clock bar signal clkb, an inverter IV3 for inverting a signal received from the node Nd11, and outputting the inverted signal to a node Nd12, and a first clock buffer unit 30 for outputting a 'high' signal to the node Nd11 when both the signal at the node Nd12 and the clock signal clk have a 'low' level, while outputting a 'low' signal to the node Nd11 when both the signal at the node Nd12 and the clock signal clk have a 'high' level. The first clock buffer unit 30 includes a pair of PMOS transistors P14 and P15 and a pair of NMOS transistor N14 and N15. The flip-flop circuit also includes a transfer gate P16–N16 consisting of a PMOS transistor P16 and an NMOS transistor N16 respectively receiving the clock signal clk and the clock bar signal clkb and serving to transfer the signal from the node Nd12 to a node Nd13 in response to the clock signal clk and clock bar signal clkb, an inverter IV4 for inverting a signal received from the node Nd13, and outputting the inverted signal to a node Nd15, an inverter INV5 for inverting the signal received from the node Nd13, and outputting the inverted signal to a node Nd14, and a second clock buffer unit 32 for outputting a 'high' signal to the node Nd13 when both the signal at the node Nd14 and the clock signal clk have a 'low' level, while outputting a 'low' signal to the node Nd13 when both the signal at the node Nd14 and the clock signal clk have a 'high' level. The second clock buffer unit 32 includes a pair of PMOS transistors P17 and P18 and a pair of NMOS transistor N17 and N18.

The transfer gate P13–N13 turns on in the 'low' level of the clock signal clk, thereby transmitting the input signal D to the node Nd11. The inverter INV3 inverts the signal from the node Nd12, and transmits the inverted signal to the node Nd12. When the clock signal clk is subsequently transited to a 'high' level, the transfer gate P13–N13 turns off, and the PMOS transistor P14 and NMOS transistor N14 turn on. At this time, a selected one of the PMOS transistor P14 and NMOS transistor N15 included in the first clock buffer unit 30 turns on in accordance with the signal from the node Nd12, thereby outputting the inverted signal from the node Nd12 to the node Nd11. Accordingly, the signal of the node Nd 12 is temporarily stored by the first clock buffer unit 30 and inverter INV3 until a next signal is inputted. Since the clock signal clk is at a 'high' state, the signal of the node Nd12 is also transmitted to the node Nd13 via the transfer gate P16–N16. The inverter INV5 inverts the signal from the node Nd13, and transmits the inverted signal to the node Nd14. At this time, the PMOS transistor P18 and NMOS transistor N17 of the second clock buffer unit 32 turn off because the clock signal clk is at a 'high' level. As a result, the second clock buffer unit 32 is not activated.

In the 'low' level of the clock signal clk in the above mentioned synchronous type flip-flop circuit, the transfer gate P13–N13 is activated to transmit the input signal D to the node Nd12, and the second clock buffer unit 32 is activated to latch the signal of the node Nd13 at the output terminal thereof. On the other hand, in the 'high' level of the clock signal clk, the transfer gate P16-N16 is activated to transmit the signal of the node Nd12 to the node Nd13, so that the transmitted signal is outputted. The first clock buffer unit 30 is also activated in the 'high' level of the clock signal clk, so that it latches the signal of the node Nd12 until a next signal is inputted.

Where the conventional synchronous type flip-flop circuits having the above mentioned configurations use a precharged differential flip-flop in order to obtain an increased operating speed, however, they involve a problem of an increase in chip area because a precharge node and elements associated with the precharge node are required. Where they use a flip-flop using no precharge node, there are advantages of a simple circuit configuration and a low consumption of electric power. In this case, however, there are a problem of a low operating speed and a problem associated with a transistor ratio.

SUMMARY OF THE INVENTION

The inventions claimed herein relate at least in one respect to a synchronous type flip-flop circuit of a semiconductor device. The circuit utilizes a precharge node, thereby being capable of achieving an improvement in operating speed while solving a problem associated with a transistor ratio.

A synchronous type flip-flop circuit of a semiconductor device is provided that includes a first clock buffer unit for buffering a complement signal of a data signal input at a first potential level of a clock signal. A second clock buffer unit buffers a complement signal of a signal output from the first clock buffer unit at the first potential level of the clock signal. A precharge latch unit precharges a first node and a second node with a supply voltage at the first potential level of the clock signal, differentially amplifying respective potentials of the first and second nodes by output signals from the first and second clock buffer units at a second potential level of the clock signal, and outputting the amplified signals while latching the amplified signals. The first potential level is a 'low' potential level, and the second potential level is a 'high' potential level.

The first clock buffer unit includes a pair of PMOS transistors connected in series between a supply voltage source and an output node, the PMOS transistors receiving the input data signal and the clock signal, respectively, and a pair of NMOS transistors connected in series between the output node and a ground voltage source, the NMOS transistors receiving a clock bar signal and the input data signal.

The second clock buffer unit includes a pair of PMOS transistors connected in series between a supply voltage source and an output node, the PMOS transistors receiving the output signal of the first clock buffer unit and the clock signal, respectively, and a pair of NMOS transistors connected in series between the output node and a ground voltage source, the NMOS transistors receiving the output signal of the first clock buffer unit and a clock bar signal.

The precharge latch unit comprises a precharge stage for precharging the first and second nodes with the supply voltage at the first potential level of the clock signal. A current source stage establishes a current path lead to a ground voltage source at the second potential level of the clock signal. An input stage discharges respective potentials of the first and second nodes to the ground voltage source via the current source stage in response to the output signals of the first and second clock buffer units. A first switching stage switches the potential of the first node to a first output terminal at the first potential level of the clock signal. A second switching stage switches the potential of the second node to a second output terminal at the first potential level of the clock signal. A latch stage connects between the first and second output terminals.

The precharge stage comprises PMOS transistors. The current source stage comprises NMOS transistors. The input stage comprises NMOS transistors. Each of the first and second switching stages comprises an NMOS transistor. The latch stage comprises two inverters connected in parallel.

BRIEF DESCRIPTION OF THE DRAWINGS

The claimed inventions will be explained in further detail with reference to the drawings, in which:

DETAILED DESCRIPTION

Now, a preferred embodiment of the present invention will be described in detail, with reference to FIG. 4.

Figure 1:
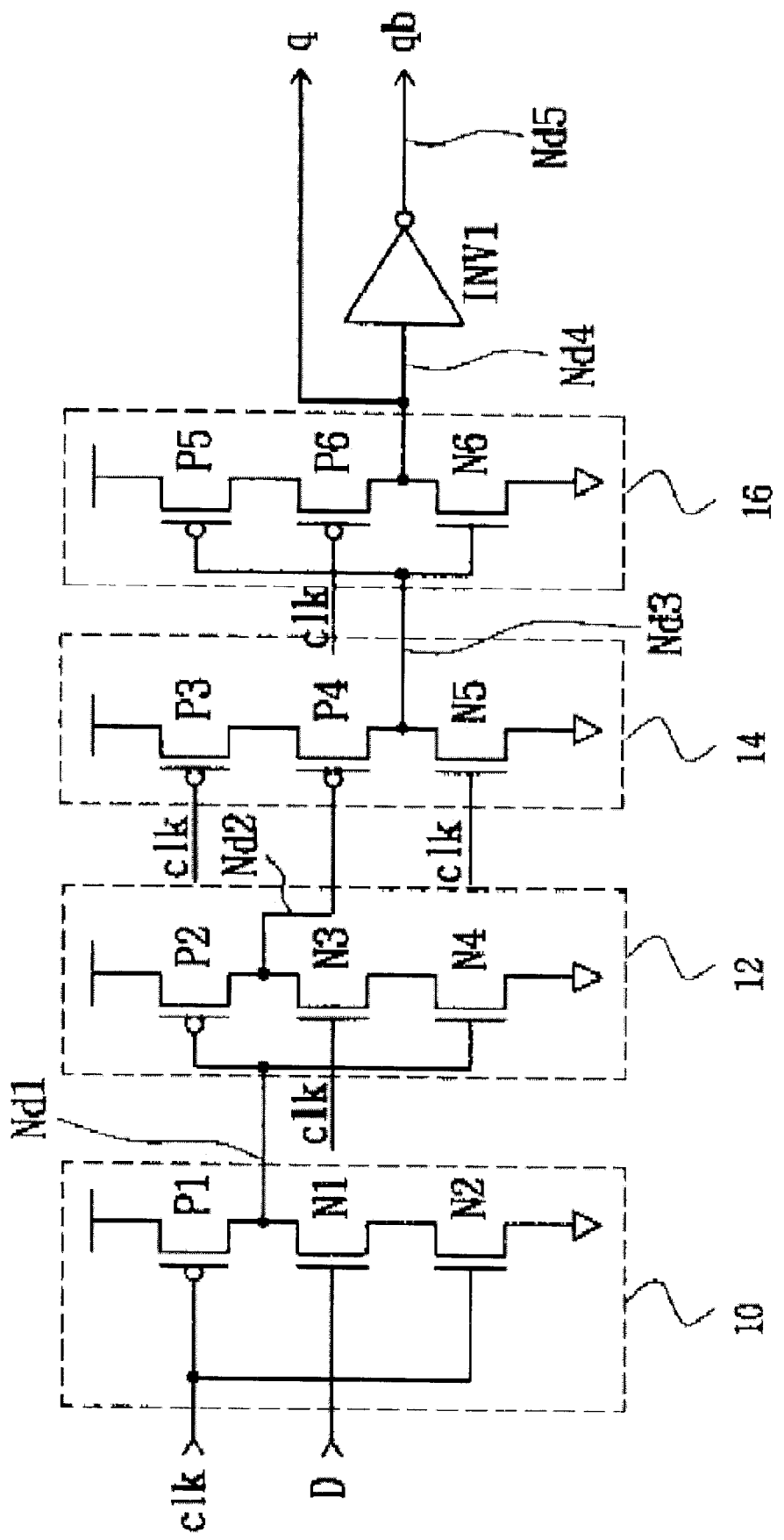
FIG. 1 is a circuit diagram illustrating a conventional synchronous type flip-flop circuit of a semiconductor device.
Figure 2:
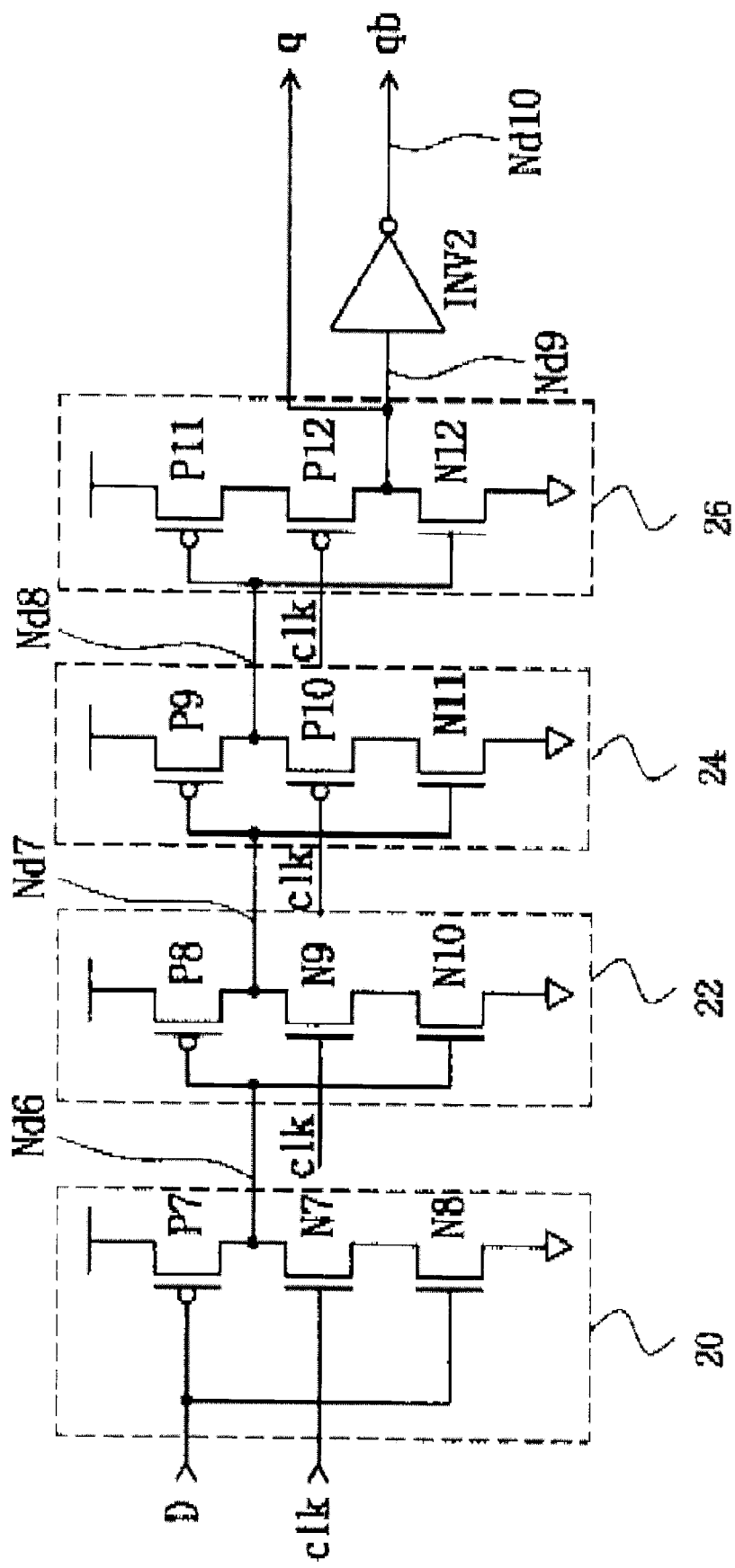
FIG. 2 is a circuit diagram illustrating another conventional synchronous type flip-flop circuit.
Figure 3:
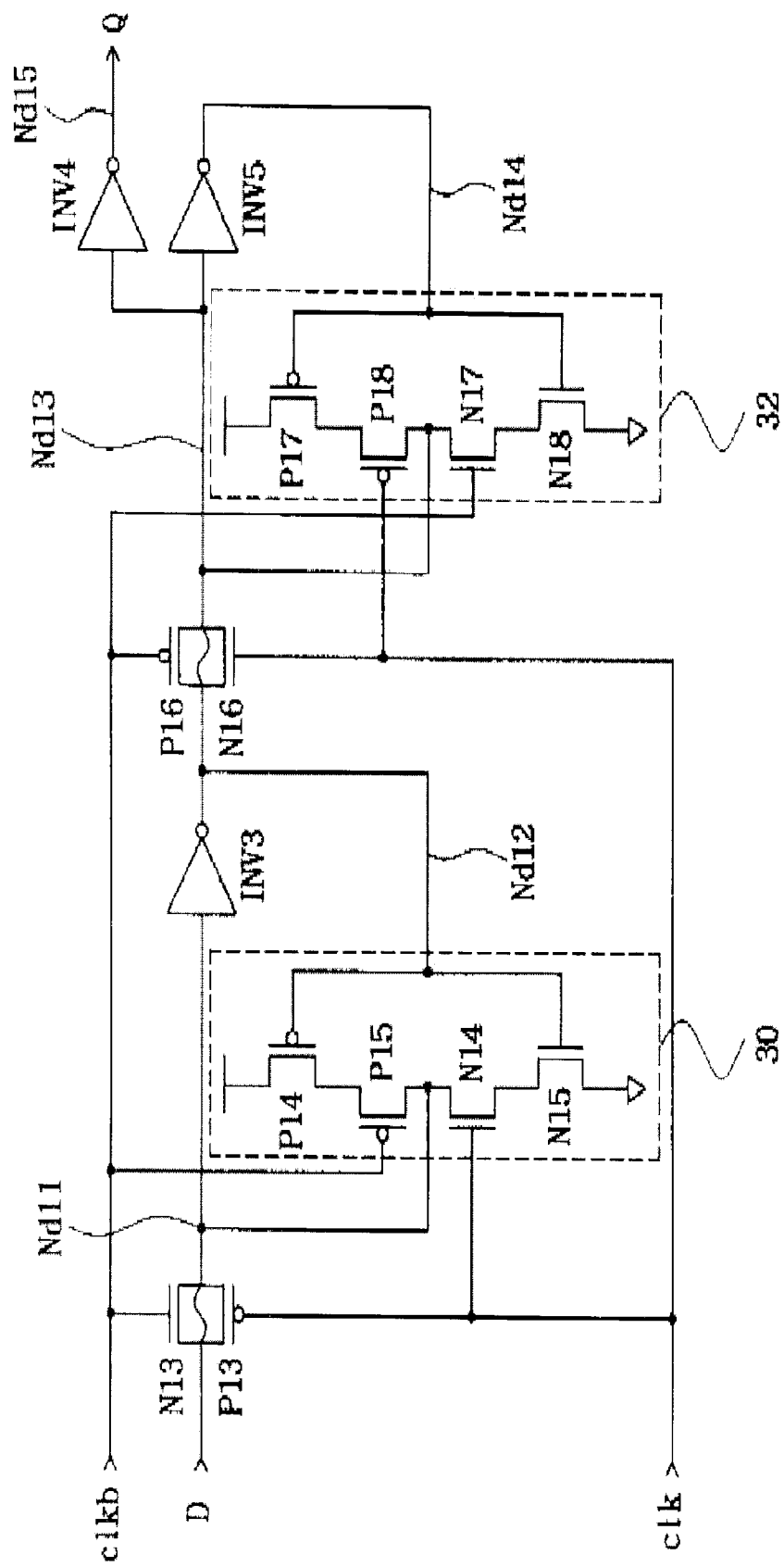
FIG. 3 is a circuit diagram illustrating another conventional synchronous type flip-flop circuit.
Figure 4:
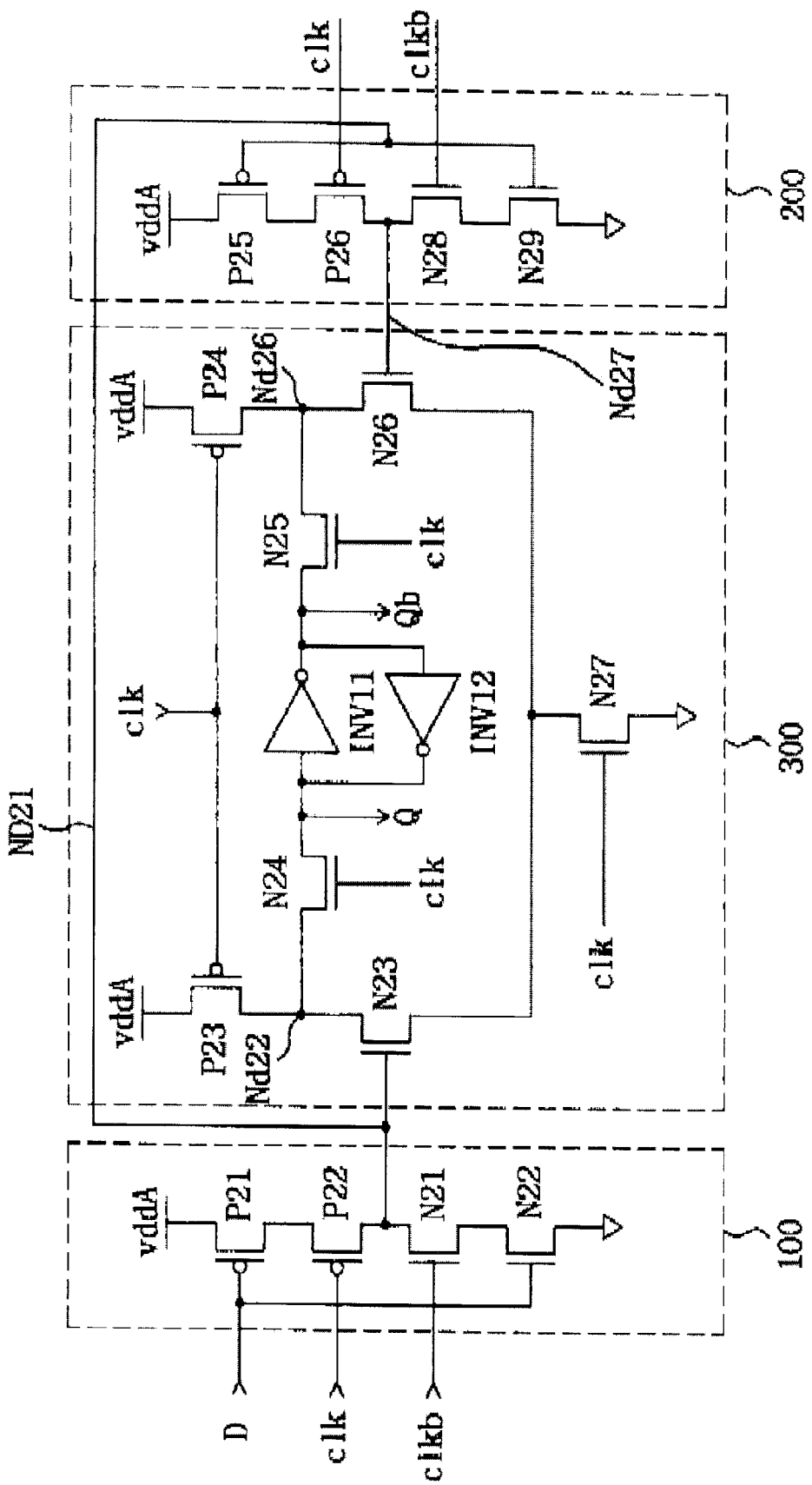
FIG. 4 is a circuit diagram illustrating a synchronous type flip-flop circuit of a semiconductor device according to the present invention.

FIG. 4 is a circuit diagram illustrating a synchronous type flip-flop circuit of a semiconductor device according to an embodiment of the present invention. The synchronous type flip-flop circuit includes a first clock buffer unit 100 for outputting a complement signal of an input signal D in a 'low' level of a clock signal clk, a second clock buffer unit 200 for outputting a complement signal to the signal outputted from the first clock buffer unit 100 in the 'low' level of the clock signal clk, and a precharge latch unit 300 for precharging nodes Nd22 and Nd26 with a supply voltage VddA in the 'low' level of the clock signal clk, differentially amplifying output signals of the first and second clock buffer units 100 and 200 in a 'high' level of the clock signal clk, and outputting the amplified signals to output terminals Q and Qb, respectively.

The first clock buffer unit 100 includes PMOS transistors P21 and P22 connected in series between the supply voltage VddA and a node Nd21. The PMOS transistors P21 and P22 receive the input signal D, which is a data signal, and the clock signal clk as gate inputs thereof, respectively. The first clock buffer unit 100 also includes NMOS transistors N21 and N22 connected in series between the node Nd21 and a ground voltage. The NMOS transistors N21 and N22 receive a clock bar signal clkb and the input signal D as gate inputs thereof, respectively. By this configuration, the first clock buffer unit 100 outputs a 'high' signal to the node Nd22 via the PMOS transistors P21 and P22 in the 'low' level of the clock signal clk in response to the 'low' level of the input signal D while outputting a 'low' signal to the node Nd22 via the NMOS transistors N21 and N22 in the 'high' level of the clock bar signal clkb in response to the 'high' level of the input signal D.

The second clock buffer unit 200 includes PMOS transistors P25 and P26 connected in series between the supply voltage VddA and a node Nd27. The PMOS transistors P25 and P26 receive the output signal of the first clock buffer unit 100, applied to the node Nd21, and the clock signal clk as gate inputs thereof, respectively. The second clock buffer unit 200 also includes NMOS transistors N28 and N29 connected in series between the node Nd27 and the ground voltage. The NMOS transistors N28 and N29 receive the clock bar signal clkb and the output signal of the first clock buffer unit 100, applied to the node Nd21, respectively. The second clock buffer unit 200 outputs a 'high' signal to the node Nd27 via the PMOS transistors P25 and P26 in the 'low' level of the clock signal clk in response to the 'low' level of the output signal of the first clock buffer unit 100 while outputting a 'low' signal to the node Nd27 via the NMOS transistors N28 and N29 in the 'high' level of the clock bar signal clkb in response to the 'high' level of the output signal of the first clock buffer unit 100.

The precharge latch unit 300 includes precharge PMOS transistors P23 and P24 respectively adapted to supply the supply voltage VddA to the nodes Nd22 and Nd26, which are precharge nodes, in the 'low' level of the clock signal clk, thereby precharging the precharge nodes Nd22 and Nd26, an NMOS transistor N27 adapted to establish a current path lead to the ground voltage in the 'high' level of the clock signal clk, and NMOS transistors N23 and N26 respectively adapted to the potentials of the precharge nodes Nd22 and Nd26 to the ground voltage via the NMOS transistor N27 in response to the signals from the nodes Nd21 and Nd27. The precharge latch unit 300 also includes NMOS transistors N24 and N25 respectively adapted to switch the signals from the precharge nodes Nd22 and Nd26 to the output terminals Q and Qb in the 'high' level of the clock signal clk, and inverter stages INV11 and INV12 connected in parallel between the output terminals Q and Qb and adapted to store respective output signals of the output terminals Q and Qb. Each of the inverter stages INV11 and INV12 comprises an inverter.

True and complement signals to the input signal D are first outputted from the first and second clock buffer units 100 and 200 to the precharge latch unit 300 in the 'low' level of the clock clk, respectively. The precharge latch unit 300 supplies the supply voltage VddA to the precharge nodes Nd22 and Nd26 via the PMOS transistors P23 and P24 in the 'low' level of the clock clk, thereby precharging the precharge nodes Nd22 and Nd26 with the supply voltage VddA. During the precharge period, that is, the 'low' level of the clock clk, the NMOS transistors N24 and N25 are turned off in response to the 'low' level of the clock clk in order to prevent the data of the output terminals Q and Qb from varying during the precharge period.

In the 'high' level of the clock clk following the 'low' level of the clock clk, the PMOS transistors P23 and P24 of the precharge latch unit 300 are turned off, and the NMOS transistor N27, which serves as a current source, is turned on. In this state, the NMOS transistors N23 and N26 turn on or off in accordance with respective output signals of the first and second clock buffer units 100 and 200 applied to the nodes Nd21 and Nd27. At this time, respective currents flowing through the NMOS transistors N23 and N26 are discharged to the ground voltage via the NMOS transistor N27. As a result, respective potentials of the precharge nodes Nd22 and Nd26 are differentially amplified. The differentially-amplified signals of the nodes Nd22 and Nd26 are stored in the latches INV11 and INV12 via the NMOS transistors N24 and N25 maintained in their ON states during the 'high' level of the clock clk, while being outputted to the output terminals Q and Qb as data, respectively.

The latch stages INV11 and INV12 connected between the output terminals Q and Qb latch the stored data as previous data because the NMOS transistors N24 and N25 are turned off when the clock signal clk is transited to a 'low' level thereof.

The synchronous flip-flop circuit of the present invention uses the clock buffer units 100 and 200, and the precharge latch unit 300 in different manners from the manner in which conventional synchronous flip-flop circuits use inverters, pass transistors, or clock buffers. Since the clock buffer units 100 and 200, which receive an input data signal, always transition from a 'high' level to a 'low' level, there is no problem involved due to the fact that PMOS transistors have a lower operating speed than that of NMOS transistors. Accordingly, the PMOS transistors used in the synchronous type flip-flop circuit of the present invention can be made small to achieve a reduction in load and a reduced consumption of electric power. The NMOS transistors used in the synchronous type flip-flop circuit of the present invention can also have a minimized size to reduce the set-up time of the differential latches. The NMOS transistor N27 of the precharge latch unit 300, which serves as a current source, can operate without generating any problem, in so far as an amount of current sufficient to activate the latch circuit is supplied. Accordingly, the NMOS transistor N27 can have a minimized size without any requirement to take into consideration the ratio of inverters used in the latch circuit. The synchronous flip-flop circuit of the present invention can also be designed to have a symmetrical layout. Although a process variation may occur in the fabrication of the circuit, it has the same influence on the symmetrical portions of the circuit. Accordingly, the influence of the process variation is reduced. Therefore, it is unnecessary for the synchronous type flip-flop circuit of the present invention to take into consideration problems associated with a transistor ratio. This enables a reduced circuit area and an increased operating speed.

What is claimed is:

1. A synchronous type flip-flop circuit of a semiconductor device comprising:

a first clock buffer unit constructed and arranged to buffer a complement signal of a data signal input at a first potential level of a clock signal;

a second clock buffer unit constructed and arranged to buffer a complement signal of a signal output from the first clock buffer unit at the first potential level of the clock signal; and a precharge latch unit constructed and arranged to precharge a first node and a second node with a supply voltage at the first potential level of the clock signal, differentially amplifying respective potentials of the first and second nodes by output signals from the first and second clock buffer units at a second potential level of the clock signal, and outputting the amplified signals while latching the amplified signals.

2. A circuit according to claim 1, wherein the first potential level is a 'low' potential level, and the second potential level is a 'high' potential level.

3. A circuit according to claim 1, wherein the first clock buffer unit comprises:

a pair of PMOS transistors connected in series between a supply voltage source and an output node, the PMOS transistors receiving the input data signal and the clock signal, respectively; and a pair of NMOS transistors connected in series between the output node and a ground voltage source, the NMOS transistors receiving a clock bar signal and the input data signal.

4. A circuit according to claim 1, wherein the second clock buffer unit comprises:

a pair of PMOS transistors connected in series between a supply voltage source and an output node, the PMOS transistors receiving the output signal of the first clock buffer unit and the clock signal, respectively; and a pair of NMOS transistors connected in series between the output node and a ground voltage source, the NMOS transistors receiving the output signal of the first clock buffer unit and a clock bar signal.

5. A circuit according to claim 1, wherein the precharge latch unit comprises:

a precharge stage constructed and arranged to precharge the first and second nodes with the supply voltage at the first potential level of the clock signal;

a current source stage constructed and arranged to establish a current path lead to a ground voltage source at the second potential level of the clock signal;

an input stage constructed and arranged to discharge respective potentials of the first and second nodes to the ground voltage source via the current source stage in response to the output signals of the first and second clock buffer units;

a first switching stage constructed and arranged to switch the potential of the first node to a first output terminal at the first potential level of the clock signal;

a second switching stage constructed and arranged to switch the potential of the second node to a second output terminal at the first potential level of the clock signal; and a latch stage connected between the first and second output terminals.

6. A circuit according to claim 5, wherein the precharge stage comprises PMOS transistors.

7. A circuit according to claim 5, wherein the current source stage comprises NMOS transistors.

8. A circuit according to claim 5, wherein the input stage comprises NMOS transistors.

9. A circuit according to claim 5, wherein each of the first and second switching stages comprises an NMOS transistor.

10. A circuit according to claim 5, wherein the latch stage comprises two inverters connected in parallel.

* * * * *